(12) United States Patent
Tobben et al.

(10) Patent No.: US 6,261,950 B1
(45) Date of Patent: Jul. 17, 2001

(54) SELF-ALIGNED METAL CAPS FOR INTERLEVEL METAL CONNECTIONS

(75) Inventors: Dirk Tobben, Langebrueck (DE); Jeffrey Gambino, Westford, VT (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/420,402

(22) Filed: Oct. 18, 1999

(51) Int. Cl.[7] .................. H01L 21/4763; H01L 21/44
(52) U.S. Cl. ............... 438/641; 438/626; 438/633; 438/660; 438/661; 438/674; 438/685; 438/681; 438/688
(58) Field of Search ................ 438/687–688, 438/622–625, 626, 627, 633, 637–641, 648, 660–662, 674, 685

(56) References Cited

U.S. PATENT DOCUMENTS

| | | | |
|---|---|---|---|
| 5,305,519 | * | 4/1994 | Yamamoto et al. .................. 29/852 |
| 5,759,915 | * | 6/1998 | Matsunaga et al. ................ 438/627 |
| 6,066,558 | * | 5/2000 | Kawano et al. .................... 438/642 |

* cited by examiner

Primary Examiner—John F. Niebling
Assistant Examiner—Ha Tran Nguyen
(74) Attorney, Agent, or Firm—Donald B. Paschburg

(57) ABSTRACT

A method for connecting metal structures with self-aligned metal caps, in accordance with the invention, includes providing a metal structure in a first dielectric layer. The metal structure and the first dielectric layer share a substantially planar surface. A cap metal is selectively depositing on the metal structure such that the cap metal is deposited only on the metal structure. A second dielectric layer is formed over the cap metal. The second dielectric layer is opened to form a via terminating in the cap metal. A conductive material is deposited in the via to provide a contact to the metal structure through the cap metal.

15 Claims, 5 Drawing Sheets

SELF-ALIGNED METAL CAPS FOR INTERLEVEL METAL CONNECTIONS

BACKGROUND

1. Technical Field

This disclosure relates to semiconductor fabrication and more particularly, to a method and apparatus for an improved interface between metal lines by providing a metal cap.

2. Description of the Related Art

Contact yield to Aluminum (Al) dual damascene levels is often limited by Al compounds, such as AlOx, which are created at the bottom of a via as a combination of subsequent process steps on the chemically unstable Al surface left by a chemical mechanical polish (CMP) process. These process steps typically include insulator deposition, reactive ion etch (RIE) during the via (over)etch, resist ashing, and chemical wet cleans. These compounds and/or residuals are also hard to remove in a pre-metal deposition sputter clean which often results in bad yields. Another problem with damascene structures is that there is no redundant conductor on top of the Al lines; the lack of a redundant conductor may degrade the reliability of the interconnect.

Back-end-of-line (BEOL) metallization schemes to realize interconnects in integrated circuits (ICs) can be realized by subtractive methods or damascene methods. In subtractive methods, a blanket metal film is patterned via photo lithography and etching. The metal film is usually a stack consisting of a low-resistivity material, such as aluminum sandwiched between barrier and liner metals such as titanium, titanium nitride or a combination of both. The resulting spaces between the lines are later filled with a dielectric.

In the case of damascene methods, a dielectric is deposited first as a blanket film. Trenches are then generated via lithography and etching techniques. These are filled with metal, again usually a stack of different types, which is then polished back to the surface of the dielectric (CMP). Typically, some overpolish is performed to ensure that there are no shorts through remaining metal between the lines. The damascene process can be easily broadened to a dual damascene process by subsequently forming vias to a lower level and trenches to hold an interconnect of a level to be realized. The vias and trenches are formed in a same blanket dielectric film prior to metal deposition and CMP processes. Dual damascene processes are typically less expensive due to the reduction of process steps. In addition, as ground rules continue to shrink, it is easier to etch dielectrics, such as, silicon oxide than it is to etch metal stacks.

Another difference between a damascene and a subtractive metallization method is that the damascene method leaves a polished surface of Al or AlCu behind which is far more reactive than Ti or TiN. This lack of a redundant conductor may degrade the reliability of the interconnect.

Because of the fact that a damascene scheme ends with a CMP step which leaves a rather reactive surface behind as described above, the next contact level needs to form a good and reliable interface with this critical surface. This is independent of the type of interconnect chosen, whether it be another dual damascene level, a stud process, or a tapered via process. The quality of the interface will depend strongly on the local composition of the polished surface. The smaller the vias get, the larger the local variations become due to effects like, for example, copper (Cu) segregation or different degrees of local oxidation. Residuals or compounds formed in the via etch process may also contribute to these effects. These effects are difficult to control or eliminate with cleaning steps.

Referring to FIG. 1, a dielectric layer 12 is patterned to form a via 14 and a trench 16. Via 14 and trench are filled with a metal, such as Al. Another dielectric layer 18 is deposited and patterned to form a via 20. During patterning of via 20, a portion 22 of Al oxidizes. This oxidation is particularly difficult to clean. When another conductive material 26, such as Al, is deposited, the interface between material 26 and an interconnect 24 includes an oxide therebetween which increases resistance, reduces yield and decreases reliability.

Therefore, a need exists for a more reliable and better controlled interface between levels of metal connections.

SUMMARY OF THE INVENTION

A method for connecting metal structures with self-aligned metal caps, in accordance with the invention, includes providing a metal structure in a first dielectric layer. The metal structure and the first dielectric layer share a substantially planar surface. A cap metal is selectively deposited on the metal structure such that the cap metal is deposited only on the metal structure. A second dielectric layer is formed over the cap metal. The second dielectric layer is opened to form a via terminating in the cap metal. A conductive material is deposited in the via to provide a contact to the metal structure through the cap metal.

In alternate methods, the metal structure may include aluminum or copper, and the cap metal may include tungsten. The contact may include aluminum or copper. The step of cleaning the cap metal through the via may be included. The cap metal may include a thickness of between about 300 Å to about 500 Å.

Another method for connecting metal structures with self-aligned metal caps, in accordance with the invention, includes providing a metal structure in a first dielectric layer. The metal structure and the first dielectric layer share a substantially planar surface. A refractory metal is deposited on the metal structure and the first dielectric layer. An alloy is formed between the metal structure and the refractory metal such that the alloy only forms on the substantially planar surface over the metal structure. The refractory metal is removed to the first dielectric layer such that a portion of the alloy remains with the metal structure. A second dielectric layer is formed over the alloy. The second dielectric layer is opened to form a via terminating in the alloy. A conductive material is deposited in the via to provide a contact to the metal structure through the alloy.

In alternate methods, the metal structure may include aluminum or copper. The refractory metal may include titanium, magnesium, nickel, tantalum, hafnium, and/or niobium. The contact may include aluminum or copper. The step of cleaning the cap metal through the via may be included. The cap metal may include a thickness of between about 300 Å to about 500 Å. The step of forming an alloy may include the step of sintering to greater than about 405° C. The step of removing the refractory metal may include etching the refractory metal with an etchant. The step of removing the refractory metal may include polishing the refractory metal.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method and apparatus for an improved interface between metal lines by providing a metal cap. A better defined interface is provided by the present invention by depositing a self-aligned refractory metal cap on a metal line or conductive surface. The metal cap serves as an etch stop before the metal is etched in a via, and provides easier handling in terms of chemical and sputter cleans prior to the next metal deposition. Embodiments of the present invention include selectively depositing a refractory metal layer, such as tungsten, on a metal layer or depositing a blanket film, forming an alloy with a metal via, a sintering step, and removing the non-alloyed refractory metal. The present invention addresses the problem of creating a reliable and repeatable contact to a metal level for creating a more controllable interface.

Figure 1:
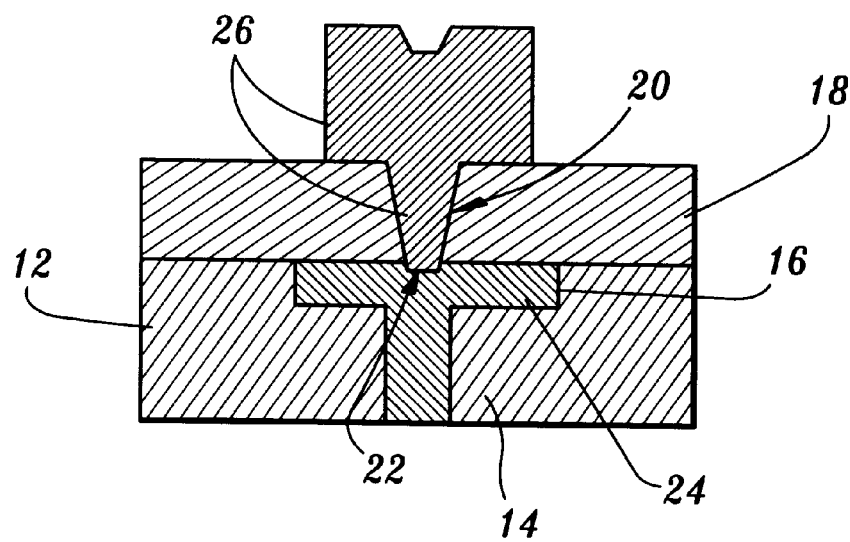
FIG. 1 is a cross-sectional view of a conventional contact structure.
Figure 2:
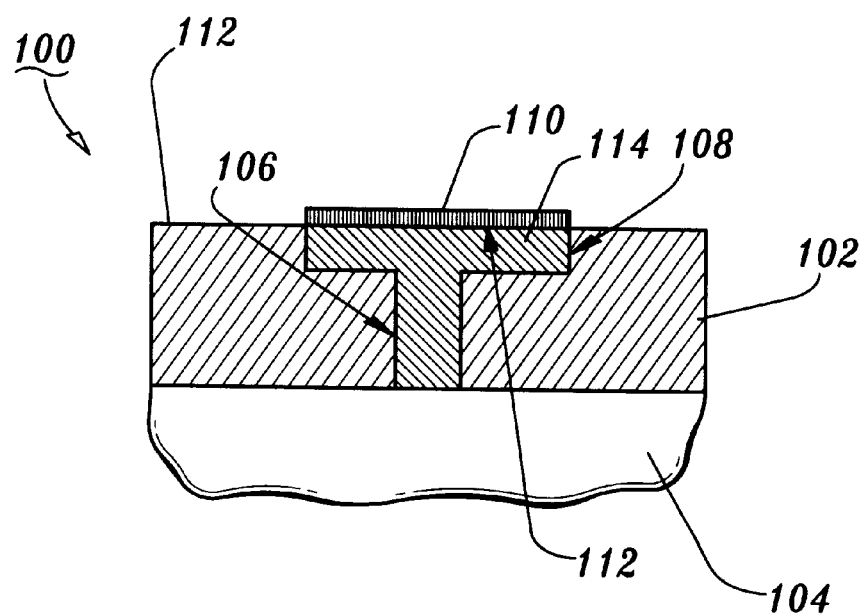
FIG. 2 is a cross-sectional view of a metal structure having a cap metal formed thereon in accordance with the present invention.

Referring now in specific detail to the drawings in which like reference numerals identify similar or identical elements throughout the several views, and initially to FIG. 2, a cross-sectional view of a partially fabricated semiconductor device 100 is shown in accordance with the present invention. Device 100 may include a memory device, such as a dynamic random access memory device, a processor on any other type of semiconductor device employing metal lines and interlevel contacts. A dielectric layer 102 is deposited on a substrate 104 or other layer in accordance with a device to be fabricated. Dielectric layer may include any dielectric layer employed for semiconductor processing. In one embodiment, dielectric layer 102 includes silicon dioxide. A via 106 and a trench 108 are etched into dielectric layer 102. Via 106 and trench 108 may be etched by masking dielectric layer 102 and employing, for example, a reactive ion etch (RIE) process. Alternately, dielectric layer 102 may include a via or a trench or other structure for including a conductive path for which the present invention may be employed. Via 106 and trench 108 are filled with a metal, such as, for example Al, Cu and their alloys, to form a conductive structure 114. A top surface 112 of structure 114 is planarized, for example by CMP, to provide a planar surface. A cleaning step may be employed to strip surface 112 of any native oxide (though this might not be necessary).

A selective deposition process is employed to deposit a metal layer 110, such as, tungsten on the polished metal surface of structure 114 before a next interlayer dielectric layer is put down. In one embodiment, a selective tungsten deposition is employed by CVD. When a metal is deposited by chemical vapor deposition (CVD), the metal forms preferentially on metal surfaces rather than on insulators. This effect has been employed to selectively deposit tungsten plugs in vias connecting to subsequent metal layers as described in U.S. Pat. No. 5,587,339, to Wyborn et al., incorporated herein by reference, or to coat the sidewalls of Al lines realized in a subtractive scheme as described in U.S. Pat. No. 5,192,715, to Sliwa, et al., also incorporated herein by reference. The present invention selectively deposits metal layer 110, preferably W, on structure 114. Other metals and compounds may be used, for example, TiN, Ti, Ta, or TaN, which are selectively deposited.

Figure 3:
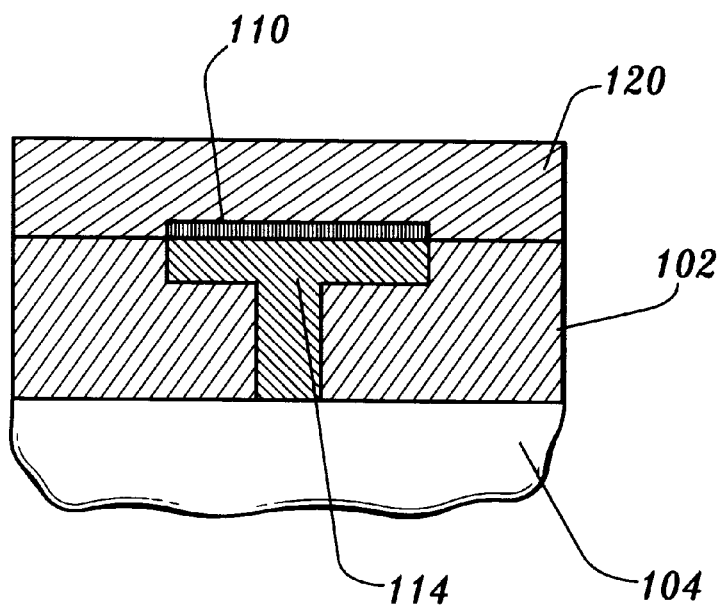
FIG. 3 is a cross-sectional view of the structure of FIG. 2 showing a dielectric layer formed in accordance with the present invention.

Time may be minimized between CMP of structure 114 and metal layer 110 deposition to be sure that surface 112 is not re-oxidized on structure 114. Metal layer 110 preferably includes a minimum thickness which is larger than that of the overetch of the next via level into the metal layer 110 (see below). The maximum thickness of metal layer 110 is preferably determined such a next interlayer dielectric 120 as shown in FIG. 3 is preferentially deposited as a blanket (preferably by a plasma enhanced CVD (PECVD) with limited gap fill capabilities. Also, the following lithography should not suffer by too much topography. Hence, a preferable thickness of metal layer 110 is between about 300 Å to about 500 Å. This is relatively thin compared to typical Al damascene thickness between 2000 Å–5000 Å. Interlayer dielectric 120 may also include silicon dioxide or any other suitable dielectric layer.

Figure 4:
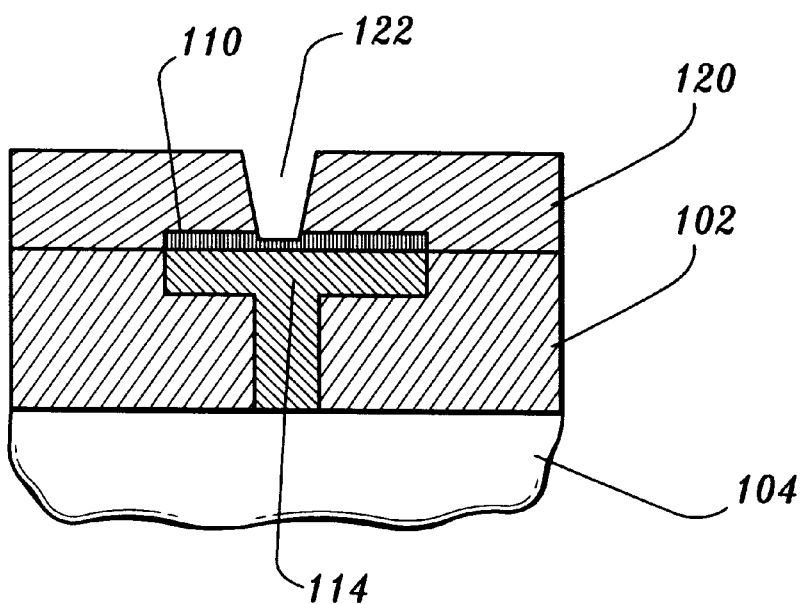
FIG. 4 is a cross-sectional view of the structure of FIG. 3 showing a via formed through the dielectric layer and terminated in the cap metal in accordance with the present invention.

Referring to FIG. 4, after the deposition of interlayer dielectric 120, photo lithography and an etch step are performed to create a via 122. There is some overetch to ensure that the vias are drilled all the way to the underlying metal. Advantageously, in accordance with the present invention, the via etch terminates in layer 110. Layer 110 includes a material which is easy to clean due to the reduced chemical reactivity of the metal, for example Tungsten (W). A cleaning process with, for example, HF or tetramethyl-ammonium hydroxide (TMAH), may be performed to remove native oxide form layer 110 in accordance with the invention.

Figure 5:
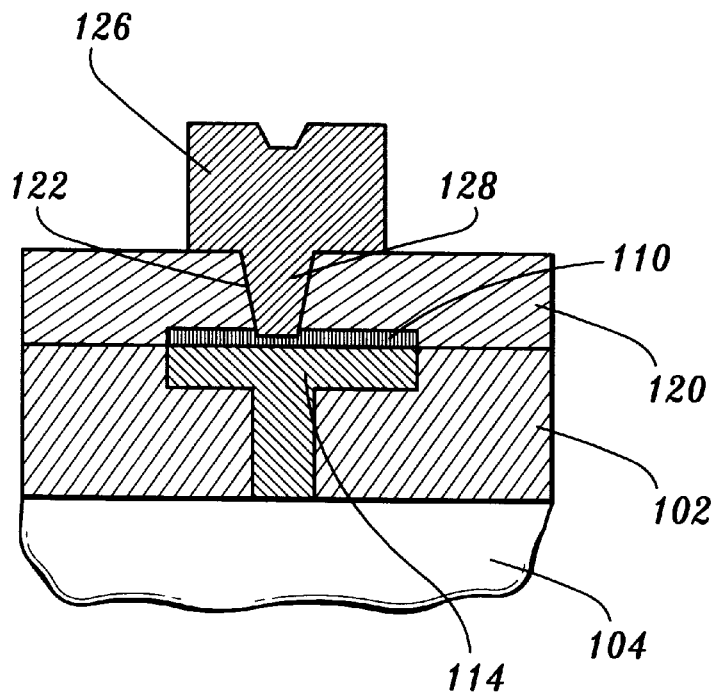
FIG. 5 is a cross-sectional view of the structure of FIG. 4 showing a contact formed in the via and termination in the cap metal in accordance with the present invention.

Referring to FIG. 5, a conductive material 126 is deposited. Material 126 may be patterned in a scheme using tapered vias or a reflow technique to achieve via fill and next-level-metal film deposition simultaneously. Material 126 may include Al or other suitable metals. Those skilled in the art will realize other materials and techniques for filling via 122 to form a contact 128. The present invention results in better process control and yield improvement for interconnects between metal layers.

Figure 6:
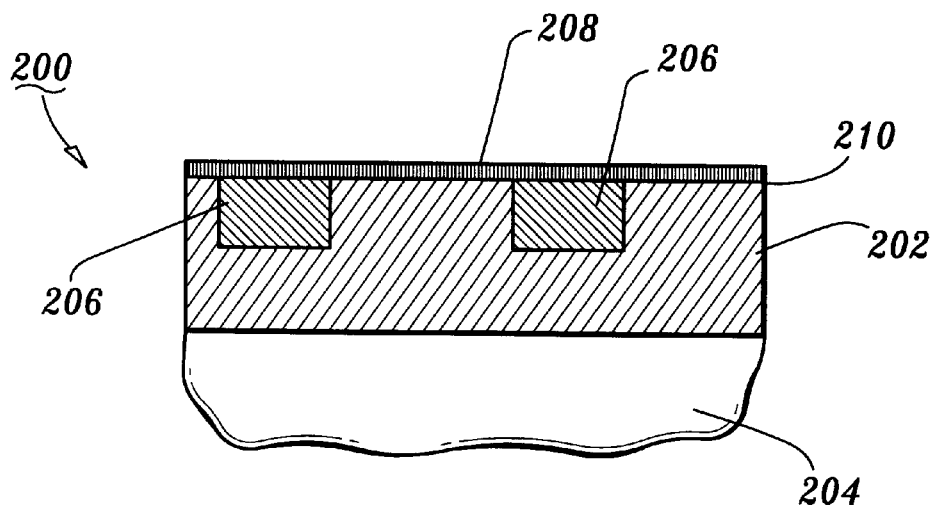
FIG. 6 is a cross-sectional view of a metal structure showing a refractory metal blanket deposited thereon in accordance with the present invention.

Referring to FIG. 6, a cross-sectional view of a partially fabricated semiconductor device 200 is shown in accordance with the present invention. Device 200 may include a memory device, such as a dynamic random access memory device, a processor on any other type of semiconductor device employing metal lines and interlevel contacts. A dielectric layer 202 is deposited on a substrate 204 or other layer in accordance with a device to be fabricated. Dielectric layer 202 may include any dielectric material employed for semiconductor processing. In one embodiment, dielectric layer 202 includes silicon dioxide. Metal structures 206 are provides in dielectric layer 202. After deposition, metal structures 206 are planarized by, for example CMP. A blanket-deposit of refractory metal 208 is performed over a surface 210 of structures 206. In one embodiment, metal structures include Al. Refractory metal 208 may include one or more of Ti, Ta, Hf, Mg, Nb and Ni. Other metals may also be employed.

Figure 7:
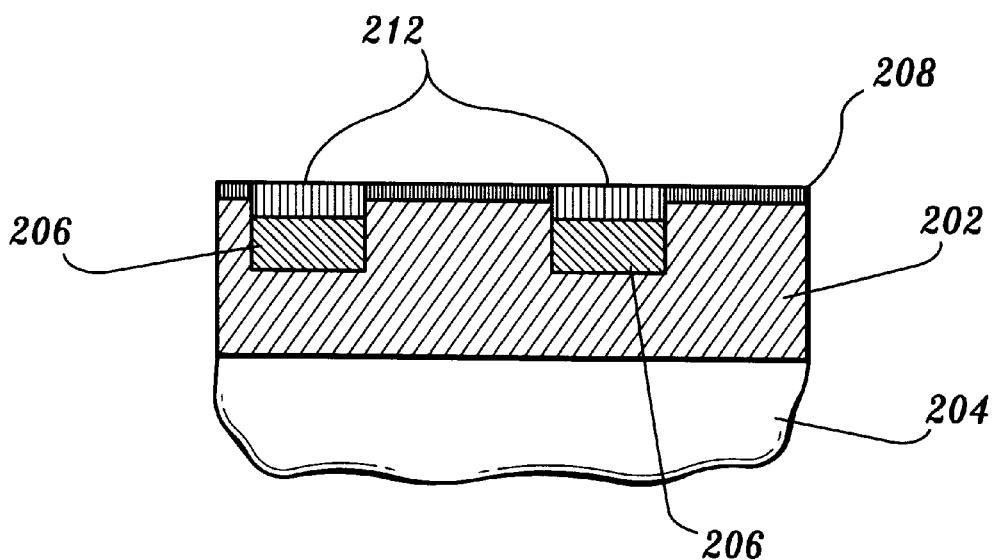
FIG. 7 is a cross-sectional view of the structure of FIG. 6 showing an alloy formed by sintering to form a cap metal in accordance with the present invention.

Referring to FIG. 7, refractory metal 208 selectively forms an alloy 212 with structures 206. Alloy 212 is formed during the deposition of refractory metal 208 or an additional anneal process may be employed to provide mixing of metals to form alloy 212. In one embodiment, a coat of Ti is deposited, e.g. sputtered. Other refractory metals could also be employed (e.g., Ta, Hf, Mg, Nb, Ni)

In addition, refractory metals, such as Ti, Ta, Hf, Mg, Nb, Ni, deposited on, for example, Al readily form alloys with the Al upon sintering at relatively low temperatures, i.e. greater than about 405° C. in certain cases. In this thermal regime, refractory metals do not yet diffuse into insulators such as dielectric layer 202 which is preferably a silicon oxide. The refractory metals and their alloys can be selectively (dry and wet) etched or polished.

In one embodiment, a sinter process having a temperature greater than about 425° C. is employed. If Al is employed for structures 206, the sintering results in the formation of $TiAl_3$ (or $NiAl_3$, $NbAl_3$, $HfAl_3$, $Mg_2Al_3$, $TaAl_3$, other phases may be achieved as well) on top of the Al while the Ti (or other metal) remains essentially unchanged over dielectric layer 202. If Cu is employed for structures 206, the sintering results in the formation of $TiCu_3$ (or $HfCu_5$, $Al_2Cu$, $MgCu_2$, $Zr_2Cu_9$, other phases may be achieved as well) on top of the Cu while the Ti (or other metal) remains essentially unchanged over dielectric layer 202. This provides self-alignment to structures 206.

Figure 8:
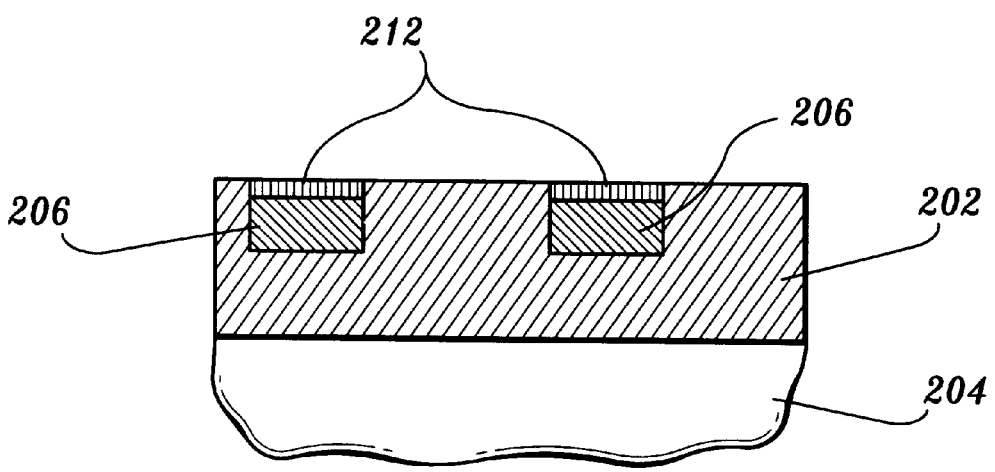
FIG. 8 is a cross-sectional view of the structure of FIG. 7 showing the refractory metal removed selective to the alloy in accordance with the present invention.

Referring to FIG. 8, refractory metal 208 is removed leaving portions of alloy 212. Refractory metal 208 is preferably removed by a Fluorine-based etch (e.g., if refractory metal 208 is Ti and structure 206 is Al, the Fluorine-based etch etches Ti faster than $TiAl_3$ and dielectric layer 202) or by a CMP (which provides even better selectively). (Chlorine based etching is employed if Cu is used). Since a Ti film may be relatively thin, its removal may only need a short "touch-up" step. Ni is preferably removed selectively with $HNO_3$ for example. Other metals, for example, Mg, Hf, or Nb are preferably removed by CMP. A preferable thickness of alloy 212 is between about 300 Å to about 500 Å.

Figure 9:
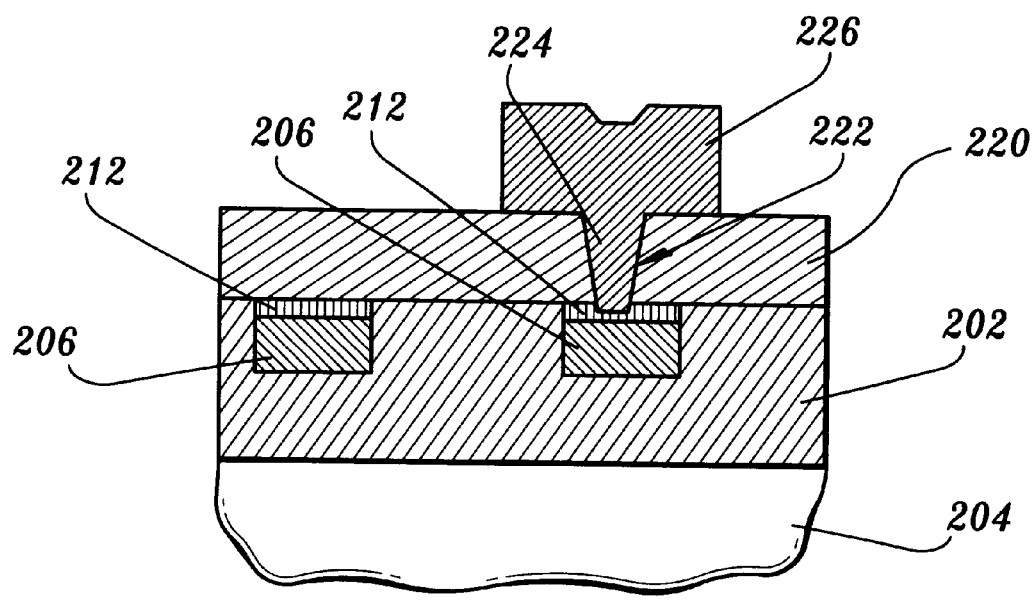
FIG. 9 is a cross-sectional view of the structure of FIG. 8 showing a contact formed which is terminated in the cap metal (alloy) in accordance with the present invention.

Referring to FIG. 9, after the deposition of interlayer dielectric 220, photo lithography and an etch step are performed to create a via 222. There is always some overetch to ensure that the vias are drilled all the way to the underlying metal. Advantageously, in accordance with the present invention, the via etch terminates in alloy 212. Alloy 212 includes a material which is easy to clean due to the reduced chemical reactivity of the metal, for example $TiAl_3$. Via 222 is formed as described above for via 122. A cleaning process may be performed to remove native oxide from alloy 212 in accordance with the invention.

A conductive material 226 is deposited in vias 222. Material 226 may be patterned in a scheme using tapered vias or a reflow technique to achieve via fill and next-level-metal film deposition simultaneously. Material 226 may include Al or other suitable metals. Those skilled in the art will realize other materials and techniques for filling via 222 to form a contact 224. The interface for contact via 222 is now determined by the refractory metal alloy 212 which is far less reactive and prone to attack by cleaning. The present invention results in better process control and yield improvement for interconnects between metal layers. On advantage of this embodiment is that it does not create any topography.

Figure 10:
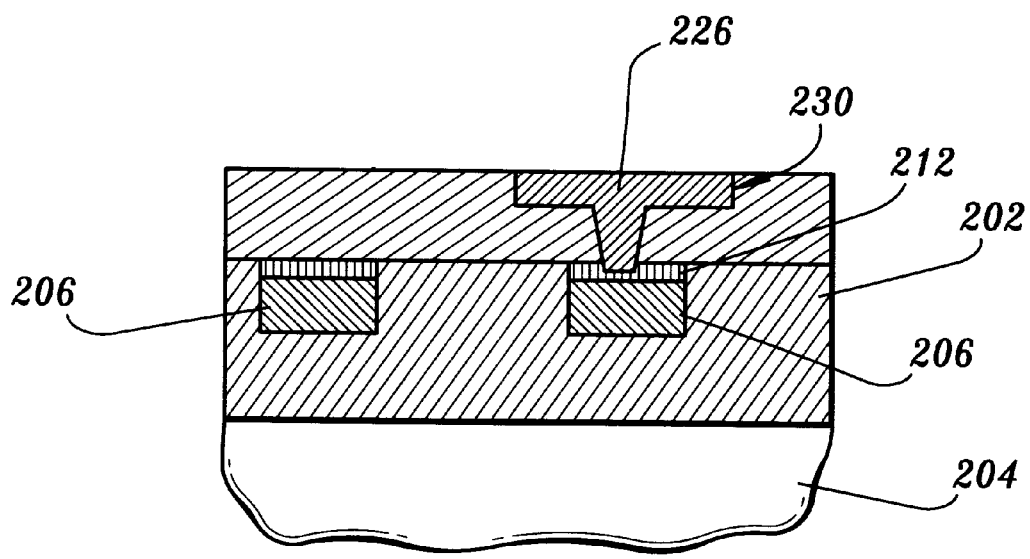
FIG. 10 is a cross-sectional view of a dual damascene structure formed in a dielectric layer in accordance with the present invention.

Referring to FIG. 10, it is to be understood that many variations of the present invention are contemplated. Material 226 may be deposited in a trench and via to form a dual damascene structure 230 as shown. Other structures may also be formed. Additionally, material 126 of FIG. 5 may also include a dual damascene structure.

Having described preferred embodiments for self-aligned metal caps for interlevel metal connections (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for connecting metal structures with self-aligned metal caps comprising the steps of:

providing a metal structure in a first dielectric layer, the metal structure and the first dielectric layer having a substantially planar surface;

selectively depositing a cap metal on the metal structure such that the cap metal is deposited only on the metal structure and grows above the substantially planar surface;

forming a second dielectric layer over the cap metal;

opening the second dielectric layer to form a via terminating in the cap metal; and depositing a conductive material in the via to provide a contact to the metal structure through the cap metal, the cap metal being disposed between the contact and the metal structure.

2. The method as recited in claim 1, wherein the metal structure includes one of aluminum and copper.

3. The method as recited in claim 1, wherein the cap metal includes tungsten.

4. The method as recited in claim 1, wherein the contact includes one of aluminum and copper.

5. The method as recited in claim 1, further comprising the step of cleaning the cap metal through the via.

6. The method as recited in claim 1, wherein the cap metal includes a thickness of between about 300 Å to about 500 Å.

7. A method for connecting metal structures with self-aligned metal caps comprising the steps of:

providing a metal structure in a first dielectric layer, the metal structure and the first dielectric layer having a substantially planar surface;

depositing a refractory metal on the metal structure and the first dielectric layer;

forming an alloy between the metal structure and the refractory metal such that the alloy only forms on the substantially planar surface over the metal structure;

removing the refractory metal to the first dielectric layer such that a portion of the alloy remains with the metal structure;

forming a second dielectric layer over the alloy;

opening the second dielectric layer to form a via terminating in the alloy; and depositing a conductive material in the via to provide a contact to the metal structure through the alloy.

8. The method as recited in claim 7, wherein the metal structure includes one of aluminum and copper.

9. The method as recited in claim 7, wherein the refractory metal includes one of titanium, magnesium, nickel, tantalum, hafnium, and niobium.

10. The method as recited in claim 7, wherein the contact includes one of aluminum and copper.

11. The method as recited in claim 7, further comprising the step of cleaning the cap metal through the via.

12. The method as recited in claim 7, wherein the cap metal includes a thickness of between about 300 Å to about 500 Å.

13. The method as recited in claim 7, wherein the step of forming an alloy includes the step of sintering to greater than about 405° C.

14. The method as recited in claim 7, wherein the step of removing the refractory metal includes etching the refractory metal with an etchant.

15. The method as recited in claim 7, wherein the step of removing the refractory metal includes polishing the refractory metal.

* * * * *